(12) United States Patent
Nakada

(10) Patent No.: US 9,878,915 B2
(45) Date of Patent: Jan. 30, 2018

(54) SILICON MEMBER FOR SEMICONDUCTOR APPARATUS AND METHOD OF PRODUCING THE SAME

(71) Applicant: MITSUBISHI MATERIALS CORPORATION, Tokyo (JP)

(72) Inventor: Yoshinobu Nakada, Ageo (JP)

(73) Assignee: MITSUBISHI MATERIALS CORPORATION, Tokyo (JP)

( * ) Notice: Subject to any disclaimer, the term of this patent is extended or adjusted under 35 U.S.C. 154(b) by 449 days.

(21) Appl. No.: 14/204,082

(22) Filed: Mar. 11, 2014

(65) Prior Publication Data

US 2014/0255641 A1    Sep. 11, 2014

(30) Foreign Application Priority Data

Mar. 11, 2013 (JP) ................. 2013-048150

(51) Int. Cl.
| | |
|---|---|
| *C01B 33/00* | (2006.01) |
| *C30B 11/14* | (2006.01) |
| *C01B 33/02* | (2006.01) |
| *C30B 28/06* | (2006.01) |
| *C30B 11/02* | (2006.01) |
| *C30B 29/06* | (2006.01) |

(52) U.S. Cl.
CPC .............. *C01B 33/02* (2013.01); *C30B 11/02* (2013.01); *C30B 11/14* (2013.01); *C30B 28/06* (2013.01); *C30B 29/06* (2013.01); *Y10T 428/21* (2015.01)

(58) Field of Classification Search
CPC ......... C30B 29/06; C30B 11/14; C30B 28/06; C30B 33/02
See application file for complete search history.

(56) References Cited

U.S. PATENT DOCUMENTS 6,299,682 B1 * 10/2001 Wakita .................. C30B 11/003
117/11
2009/0047203 A1 * 2/2009 Mueller ................. C30B 29/06
423/348

(Continued)

FOREIGN PATENT DOCUMENTS

| AU | 2012203668 A1 | 7/2012 |
| CN | 1965396 A | 5/2007 |

(Continued)

OTHER PUBLICATIONS

European Search Report dated Jun. 30, 2014, issued for the European patent application No. 14158704.8.

(Continued)

*Primary Examiner* — Matthew Song
(74) *Attorney, Agent, or Firm* — Locke Lord LLP

(57) ABSTRACT

A silicon member for a semiconductor apparatus is provided. The silicon member has an equivalent performance to one fabricated from a single-crystalline silicon even though it is fabricated from a unidirectionally solidified silicon. In addition, it can be applied for producing a relatively large-sized part. The silicon member is fabricated by sawing a columnar crystal silicon ingot obtained by growing a single-crystal from each of seed crystals by placing the seed crystals that are made of a single-crystalline silicon plate on a bottom part of a crucible and unidirectionally solidifying a molten silicon in the crucible.

13 Claims, 9 Drawing Sheets

(56) References Cited

U.S. PATENT DOCUMENTS

| | | | |
|---|---|---|---|
| 2010/0193989 A1* | 8/2010 | Stoddard | C30B 11/14 264/104 |
| 2011/0297223 A1 | 12/2011 | Krause et al. | |
| 2013/0192516 A1* | 8/2013 | Chen | C30B 11/002 117/54 |

FOREIGN PATENT DOCUMENTS

| | | |
|---|---|---|
| CN | 101370969 A | 2/2009 |
| CN | 101370970 A | 2/2009 |
| CN | 101591807 A | 12/2009 |
| CN | 101755075 A | 6/2010 |
| CN | 101755077 A | 6/2010 |
| CN | 101796226 A | 8/2010 |
| CN | 102312291 A | 1/2012 |
| CN | 102703965 A | 10/2012 |
| CN | 102732943 A | 10/2012 |
| CN | 104203845 A | 12/2014 |
| EP | 2397581 A1 | 12/2011 |
| JP | 07-040567 B2 | 5/1995 |
| JP | 10-007493 A | 1/1998 |
| JP | 11-281307 | 10/1999 |
| JP | 2004-079961 A | 3/2004 |
| JP | 2010-534189 | 11/2010 |
| WO | 2009014957 | 1/2009 |
| WO | WO-2009/015168 A1 | 1/2009 |

OTHER PUBLICATIONS

Office Action dated Feb. 27, 2017 issued for corresponding Chinese Patent Application No. 201410085887.9.

Office Action dated Jun. 6, 2017 issued for corresponding Japanese Patent Application No. 2014-048157.

Office Action dated Sep. 5, 2017 issued for corresponding Chinese Patent Application No. 2014100858879.

\* cited by examiner

SILICON MEMBER FOR SEMICONDUCTOR APPARATUS AND METHOD OF PRODUCING THE SAME

BACKGROUND OF THE INVENTION

Field of the Invention

The present invention relates to a silicon member for a semiconductor apparatus and a method of producing the silicon member for a semiconductor apparatus. Specifically, the present invention related to a silicon member for dry etching.

Priority is claimed on Japanese Patent Application No. 2013-048150, filed Mar. 11, 2013, the contents of which are incorporated herein by reference.

Description of Related Art

In the apparatus used in the semiconductor device process, such as the plasma etching apparatus, the fluoride-based gas such as $CF_6$ and $SF_6$ is used for regional removal of oxide films or the like.

Etching of the silicon dioxide film on the surface of the silicon wafer is performed by applying a high-frequency voltage between the polar plate and a silicon wafer, which is the subject to be etched, flowing those fluoride-based gases into holes formed on a polar plate (electrode plate), and using the formed plasma gas (see Japanese Unexamined Patent Application, First Publication No. 2004-79961). For the electrode plates, normally the single-crystalline silicon is used (see Japanese Examined Patent Application, Second Publication No. H07-40567). Generally speaking, in order to etch uniformly, an electrode plate whose size is larger than the silicon wafer, which is the subject to be etched, is needed.

SUMMARY OF THE INVENTION

Problems to be Solved by the Invention

Recently, usage of the next generation 450 mm silicon wafer has been widely accepted. When the silicon wafer with the diameter of 450 mm is used, an electrode plate having a diameter larger than 450 mmφ is needed. Thus, electrode plates having the diameter of 480 mmφ, 500 mmφ, and more preferably 530 mmφ or more are needed. However, growing a single-crystalline silicon having such a wide diameter is difficult in the present circumstances. Additionally, even if it became possible, the production cost would be unrealistically increased. When the silicon member is in a rectangular shape, the length of a side has to be at least 450 mm or more. Thus, the length of the side has to be 500 mm or preferably 530 mm in the semiconductor part.

Under the circumstances described above, a columnar crystal silicon, which allows to produce an electrode plate whose size is 530 mmφ or more, has drawn attention these days. However, normally the columnar crystal silicon is a poly-crystalline silicon. Thus, when the poly-crystalline silicon is used for the electrode plate, problems described below and the like occur. First, particles are likely to be formed on the silicon wafer. Second, impurities segregated in the crystal grain boundaries of the electrode plate, $SiO_2$, or the like fall on the silicon wafer. Third, the difference in level is formed on the electrode plate at the crystal grain boundaries due to the different etching rates of different crystal orientations. As explained above, the device failure is occurred due to the particles or the impurities, and the unevenly formed electric field, uniform etching on the silicon wafer becomes hard to obtain for etching on the wafers with larger diameters.

The present invention is made under circumstances described above. The purpose of the present invention is to provide a silicon member having an equivalent performance to one fabricated from a single-crystalline silicon even though it is fabricated from a unidirectionally solidified silicon. In addition, it can be applied for producing a relatively large-sized part.

Means for Solving the Problem

The first aspect of the present invention is silicon member for a semiconductor apparatus, wherein the silicon member is fabricated from a columnar crystal silicon ingot obtained by growing a single-crystal from each of a plurality of seed crystals by; placing the plurality of seed crystals that are made of a single-crystalline silicon plate on a bottom part of a crucible; and unidirectionally solidifying a molten silicon in the crucible.

According to the silicon member for a semiconductor apparatus configured as in the first aspect of the present invention, the silicon member is fabricated by sawing a columnar crystal silicon ingot obtained by growing a single-crystal from each of seed crystals. Thus, the silicon member contains a very small amount of crystal grain boundaries compared to one obtained by sawing the conventional columnar crystal silicon ingot, or it contains no crystal grain boundary at all. Therefore, when it is used for the electrode plate for plasma etching for example, the particle formation or the device failure due to the falling of the impurities segregated in the crystal grain boundaries, $SiO_2$, or the like is reduced. Also, the formation of the difference in level due to the presence of different crystal grains is reduced. As a result, almost uniform etching can be obtained.

In the first aspect of the present invention, a columnar crystal silicon ingot, in which a single-crystal is grown in a predetermined plane direction from each of seed crystals, can be obtained. Because of this, the silicon member for a semiconductor apparatus with a predetermined plane direction can be obtained.

It is preferable that the silicon member for a semiconductor apparatus has a diameter exceeding 450 mmφ. More preferably, the diameter of the silicon member is 500 mmφ or more. Even more preferably, it is 530 mmφ or more.

Also, it is preferable that the silicon member for a semiconductor apparatus is used as a silicon member for dry etching.

Also, it is preferable that each of the plurality of seed crystals are aligned in the same crystal orientation in the vertical direction (the depth direction), the horizontal direction (the width direction), and the crystal-growing direction (the upward direction), when the plurality of seed crystals is placed on the bottom part of the crucible.

In this case, the single-crystals grown from each of seed crystals are grown with the same crystal orientation since each of the seed crystals is aligned in the same crystal orientation as if they are parts of a single-crystalline ingot. As a result, when the silicon member for a semiconductor apparatus obtained by sawing the pseudo-single-crystalline ingot is used as an electrode plate for plasma etching, etching uniformity can be improved further. Furthermore, the particle formation and the device failure due to the failing of the impurities segregated in the crystal grain boundaries, $SiO_2$, or the like are reduced.

It is preferable that the plurality of seed crystals contact each other so as to have no space in between when the seed crystals are placed on the bottom part of the crucible.

In this case, poly crystal being grown between the seed crystals can be prevented, since the seed crystals are placed contacting each other. Therefore, the unidirectionally solidified silicon ingot with less crystal grain boundaries can be obtained. As a result, when the silicon member for dry etching obtained by sawing the unidirectionally solidified silicon ingot with less crystal grain boundaries is used as an electrode plate for plasma etching, etching uniformity can be improved further. Furthermore, the particle formation and the device failure due to the falling of the impurities segregated in the crystal grain boundaries, $SiO_2$, or the like are reduced.

It is preferable that at least ⅓ or more of an area exposed on a surface of a utilized part is occupied by a crystal grain regarded as a single crystal grain having a same plane direction.

In the silicon member for a semiconductor apparatus obtained by sawing the conventional columnar crystal silicon ingot, the area occupied by a single crystal grain in the surface of the utilized part is less than ⅓ of the entire surface of the utilized part. Contrary to the conventional silicon member for a semiconductor apparatus, there is a very small amount of grain boundaries in the silicon member for a semiconductor apparatus configured as the above-described aspect of the present invention. Therefore, when the above-described silicon member for a semiconductor apparatus is used for an electrode plate for plasma etching for example, etching in a high uniformity can be obtained.

It is preferable that the entire utilized part is made of a single crystal grain.

In this case, the silicon member can exert performance equivalent to one fabricated by sawing a single-crystalline silicon.

It is preferable that a crystal grain boundary density P, which is defined by a formula P=LS/A, is 0.24 or less, LS being a total length of grain boundaries of crystal grains on a cross section, and A being an area of the cross section.

In the silicon member for a semiconductor apparatus configured as described above, when the above-described silicon member for a semiconductor apparatus is used for an electrode plate for plasma etching for example, etching in a high uniformity can be obtained since the crystal grain boundary density P is set to a law value, such as 0.24 or less.

Furthermore, it is preferable that an oxygen concentration in the crystal is $5 \times 10^{17}$ atoms/ml or less.

In the silicon member for a semiconductor apparatus as configure above, the etching rate can be reduced since the oxygen concentration in the crystal is $5 \times 10^{17}$ atoms/ml or less.

Also, it is preferable that a nitrogen concentration in the crystal is $7 \times 10^{14}$ atoms/ml or more and $4 \times 10^{15}$ atoms/ml or less.

In the silicon member for a semiconductor apparatus as configure above, the etching rate can be reduced since the nitrogen concentration in the crystal is $7 \times 10^{14}$ atoms/ml or more and $4 \times 10^{15}$ atoms/ml or less.

Another aspect of the present invention is a method of producing a silicon member for a semiconductor apparatus, the method including the steps of: placing a plurality of seed crystals made of a single-crystalline silicon plate on a bottom part of a crucible; melting a silicon raw material to obtain a silicon melt by inserting the silicon raw material in the crucible, in which the single-crystalline silicon is plate placed, and melting the silicon raw material in a condition where the single-crystalline silicon plate is not melted completely; unidirectionally solidifying the silicon melt to obtain a columnar crystal silicon ingot by unidirectionally solidifying the silicon melt upward from the bottom part of the crucible where the single-crystalline silicon plate is placed; and machining the columnar crystal silicon ingot to obtain the silicon member for the semiconductor apparatus.

According to the method of producing a silicon member for a semiconductor apparatus configured as described above, a silicon member containing a very small amount of crystal grain boundaries compared to one obtained by sawing the conventional columnar crystal silicon ingot, or one containing no crystal grain boundary at all can be obtained.

Effects of the Invention

The silicon member, which is an aspect of the present invention, contains a very few of crystal grains compared to a silicon member obtained by sawing the conventional columnar crystal silicon ingot. Therefore, when it is used for the electrode plate for plasma etching for example, the particle formation or the device failure due to the falling of the impurities segregated in the crystal grain boundaries, $SiO_2$, or the like is reduced. Also, the formation of the difference in level due to the presence of different crystal grains is reduced. As a result, almost uniform etching can be obtained.

BRIEF DESCRIPTION OF THE DRAWINGS

FIG. 4A is an enlarged cross-sectional view of an electrode plate manufactured from the conventional columnar crystal silicon ingot prior to use.

EMBODIMENTS OF THE INVENTION

The embodiments of the silicon member for a semiconductor apparatus related to the present invention are explained in reference to drawings below.

The silicon member, which is an embodiment of the present invention, is the silicon member used for dry etching. This silicon member for a semiconductor apparatus (the silicon member for dry etching) can be obtained from a poly-crystalline silicon ingot. More specifically, it can be obtained by sawing a columnar crystal silicon ingot manufactured by unidirectional solidification through a special process.

The columnar crystal silicon ingot used in the present embodiment is produced by casting. However, the production process is different from that of the normal columnar crystal silicon ingot. That is, the columnar crystal silicon ingot used in the present embodiment is the columnar crystal silicon ingot obtained by growing a single-crystal from each of seed crystals by placing the seed crystals that are made of a single-crystalline silicon plate on a bottom part of a crucible and unidirectionally solidifying a molten silicon in the crucible (hereinafter referred as "the pseudo-single-crystalline ingot").

As explained above, the pseudo-single-crystalline ingot of the present embodiment is a silicon ingot having multiple single-crystalline parts grown from the seed crystals. Depending on the arrangement of the seed crystals, it is possible to obtain silicon ingot, almost the entire part of which is made of a single crystal.

Figure 1:
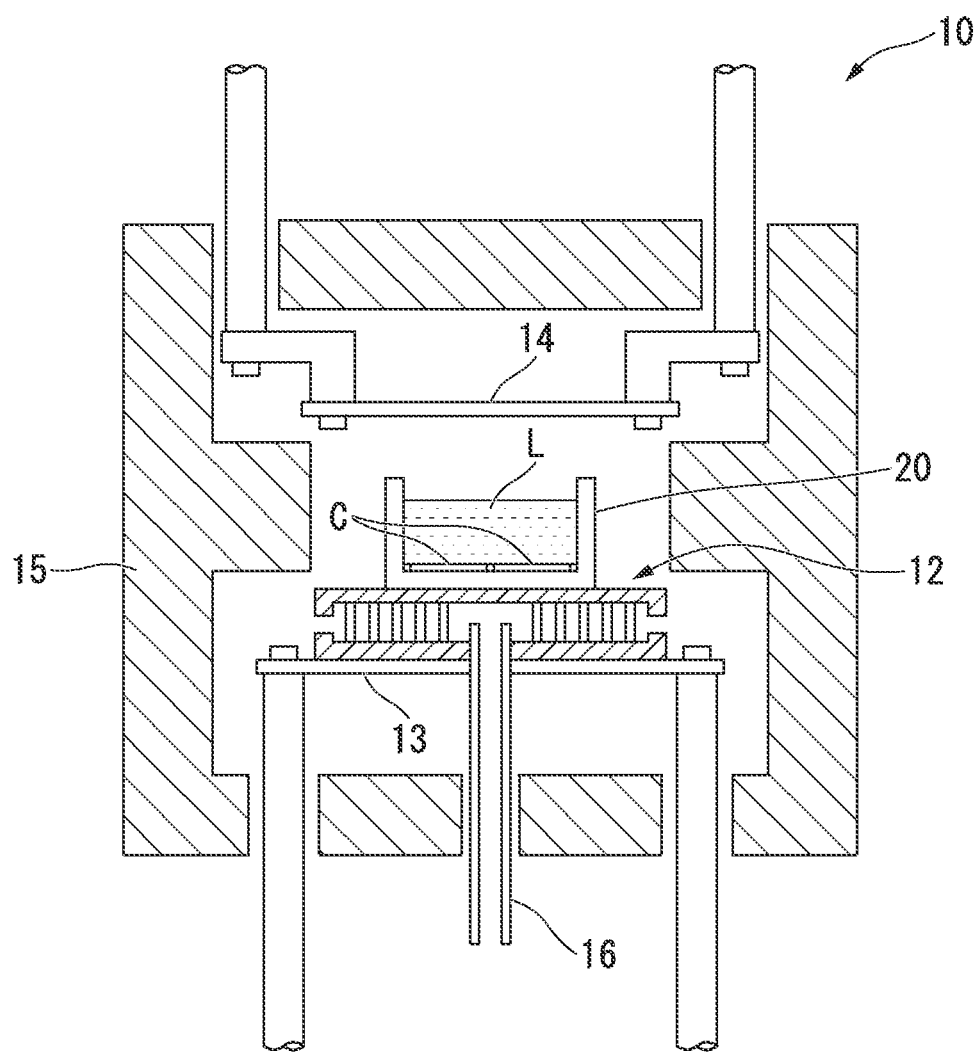
FIG. 1 is a schematic diagram of a schematic diagram of a columnar crystal silicon ingot manufacturing apparatus used in manufacturing the columnar crystal silicon ingot, which is the material of the silicon member for a semiconductor apparatus of the present embodiment.

Next, the columnar crystal silicon ingot manufacturing apparatus 10 used in manufacturing the pseudo-single-crystalline ingot, which is the material of the silicon member for a semiconductor apparatus of the present embodiment (the silicon member for dry etching), is explained in reference to FIG. 1.

The columnar crystal silicon ingot manufacturing apparatus 10 includes: the crucible 20 in which the silicon melt L is held; the chill plate 12 on which the crucible 20 is placed; the lower heater 13 supporting the chill plate 12 below; and the upper heater 14 provided above the crucible 20. Also, the heat-insulating material 15 is provided around the crucible 20.

The chill plate 12 is in a hollow structure, and is configured for Ar gas to be supplied inside through the supply pipe 16.

The horizontal cross section of the crucible 20 is in a square shape (a rectangular shape) or a round shape (a circular shape). In the present embodiment, it is in a square shape (a rectangular shape) and a round shape (a circular shape).

The crucible 20 is constituted from quartz ($SiO_2$). Its inside surface is coated by silicon nitride ($Si_3N_4$). As such, the crucible 20 is configured for the silicon melt L in the crucible 20 not to contact directly to quartz ($SiO_2$).

Next, the method of manufacturing the pseudo-single-crystalline ingot using the columnar crystal silicon ingot manufacturing apparatus 10 is explained. First, the silicon raw material is inserted in the crucible 20. Specifically, multiple seed crystals C made of a single-crystalline silicon plate are placed on the bottom part of the crucible 20 in such a way that they are in parallel with the bottom surface of the crucible 20 (Step of placing single-crystalline silicon plates). Although it is not essential, it is preferable that these seed crystals C are aligned in the same crystal orientation. Similarly, although it is not essential, it is preferable that these seed crystals C contact each other without a space in between.

Figure 16A:
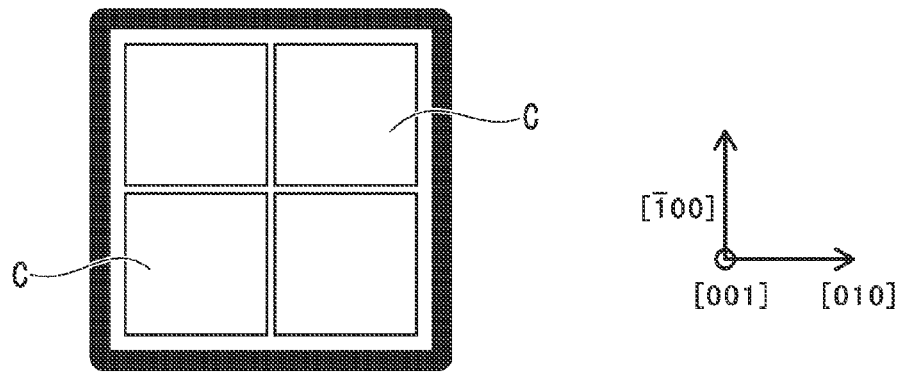
FIGS. 16A, 16B, and 16C indicate examples of placements of the seed crystals in casting of the pseudo-single-crystalline ingot. The plane directions of the crystals are shown in the arrows within the drawings.
Figure 16B:
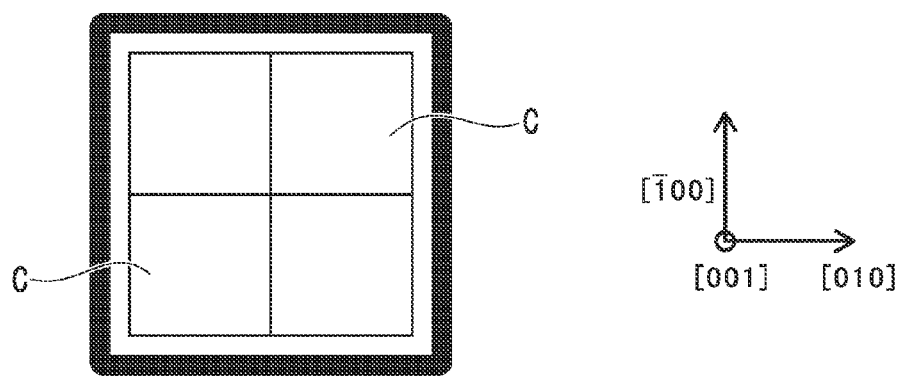
Figure 16C:
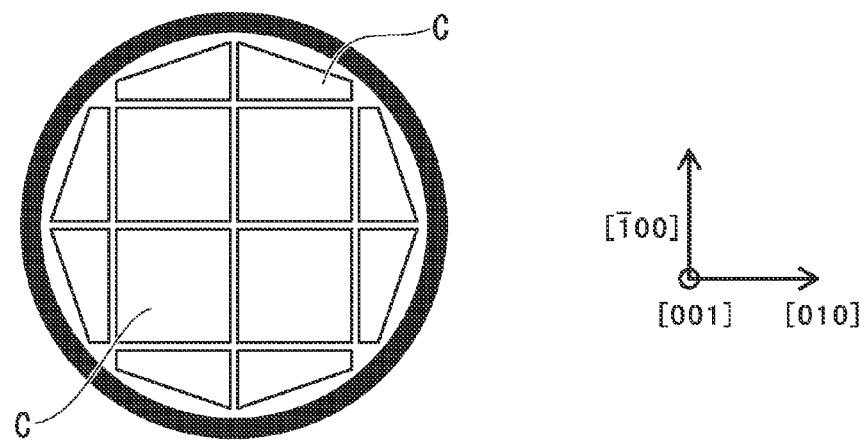

Examples of placements of the seed crystals C in casting of the pseudo-single-crystalline ingot are shown in FIGS. 16A to 16C. FIG. 16A indicates the case where they are arranged on the bottom part of the square-shaped crucible with a space in between in the same crystal orientation. FIG. 16B indicates the case where they are arranged on the bottom part of the square-shaped crucible without a space in between in the same crystal orientation. FIG. 16C indicates the case where they are arranged on the bottom part of the round-shaped crucible with a space in between in the same crystal orientation. The arrows and symbols in the drawings indicate the orientation of the seed crystals C when they are placed.

Then, the massive materials, which are obtained by crushing the 11N high purity poly-silicon (purity: 99.999999999) and called as "chunks", are placed on the upper side of the seed crystals C. The size of the silicon raw materials in the massive form is 30 mm to 100 mm, for example.

The silicon raw material placed as described above are heated by applying electricity to the upper heater 14 and the lower heater 13. At this time, in order to avoid the seed crystals C placed on the bottom part of the crucible 20 from being melted completely, the output of the lower heater 13 is regulated, and mainly the chunks existing on top of the seed crystals C are melted from the topside (Step of melting a silicon raw material). By following the procedures described above, the silicon melt is held in the crucible 20.

Next, the electric power to the lower heater 13 is reduced, and Ar gas is supplied to the inside of the chill plate 12 through the supply pipe 16. Because of these procedures, the bottom part of the crucible 20 is cooled down. By further reducing the electric power to the upper heater 14 gradually, crystals are grown in the silicon melt L in the crucible 20 continued from the seed crystals C placed on the bottom part of the crucible 20. As a result, the crystals are grown from the seed crystals C retaining their crystal orientation of the seed crystals C. Thus, the columnar crystal silicon ingot with a single-crystalline part whose size is the same as the seed crystals C in the planar direction (the pseudo-single-crystalline silicon ingot) is casted by the unidirectionally solidification method (Step of unidirectionally solidifying). The pseudo-single-crystalline silicon ingot obtained as described above has a property of single-crystal even though it is a poly-crystal.

By machining the pseudo-single-crystalline silicon ingot obtained as described above, the surface of the ingot is polished until it obtains flatness of a mirror-polished surface or higher (step of machining). Because of the procedure, the silicon member for a semiconductor apparatus (the silicon member for dry etching), such as the silicon member for plasma etching used in the reaction chamber for plasma etching, is manufactured. As an example of the silicon member for plasma etching, the electrode plate can be named.

Figure 2A:
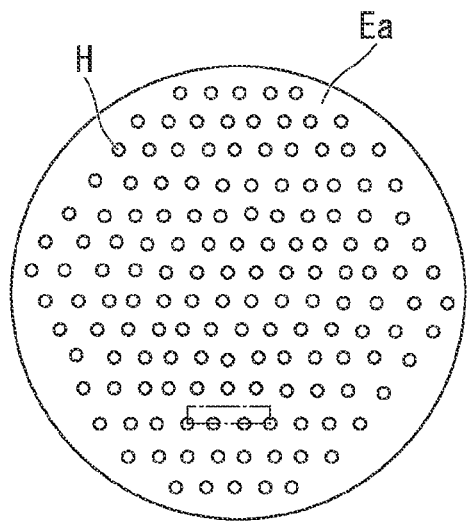
FIG. 2A is a plan view of an electrode plate manufactured from a single-crystalline silicon.
Figure 2B:
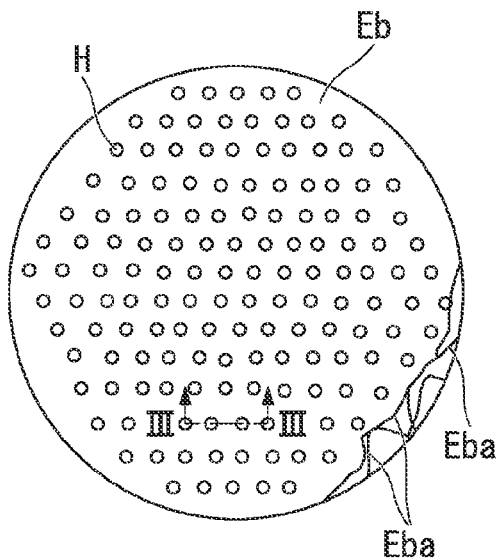
FIG. 2B is a plan view of the electrode plate manufactured from the pseudo-single-crystalline ingot related to the present invention.

FIGS. 2A and 2B indicate an electrode plate for plasma etching (hereinafter referred as "an electrode plate"). FIG. 2A shows an electrode plate Ea manufactured from a single-crystalline silicon. FIG. 2B shows the electrode plate Eb manufactured from the pseudo-single-crystalline ingot related to the present invention. As indicated in FIG. 2B, the electrode plate Eb manufactured from the pseudo-single-crystalline ingot includes the crystal grain boundary Eba locally and made of a poly-crystal.

Multiple holes H are formed on the electrode plates Ea, Eb for a fluoride-based gas to be passed through. In the electrode plate Eb produced from the pseudo-single-crystalline silicon ingot, the holes H are formed in the single-crystalline part.

Figure 3A:
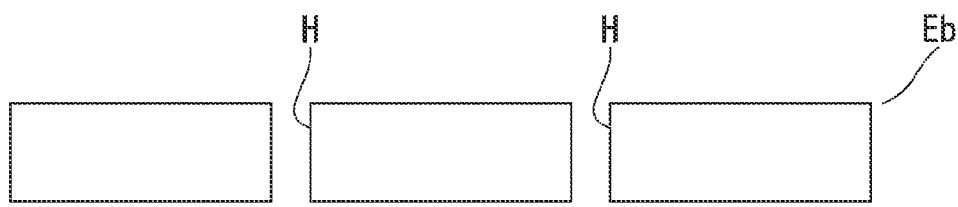
FIG. 3A is an enlarged cross-sectional view in the location indicated by "III" in FIG. 2B and shows the status of the electrode plate manufactured from the pseudo-single-crystalline ingot prior to use.
Figure 3B:
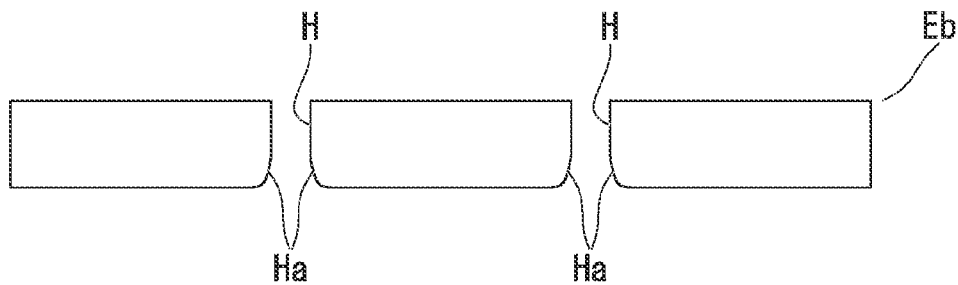
FIG. 3B is an enlarged cross-sectional view in the location indicated by "III" in FIG. 2B and shows the status of the electrode plate manufactured from the pseudo-single-crystalline ingot prior after use.
Figure 4A:
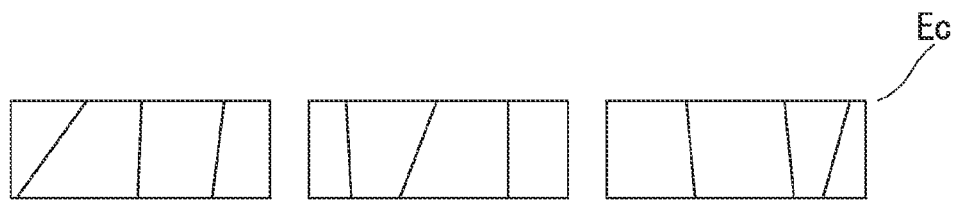
FIG. 4A is shown as a comparison with the present embodiment.
Figure 4B:
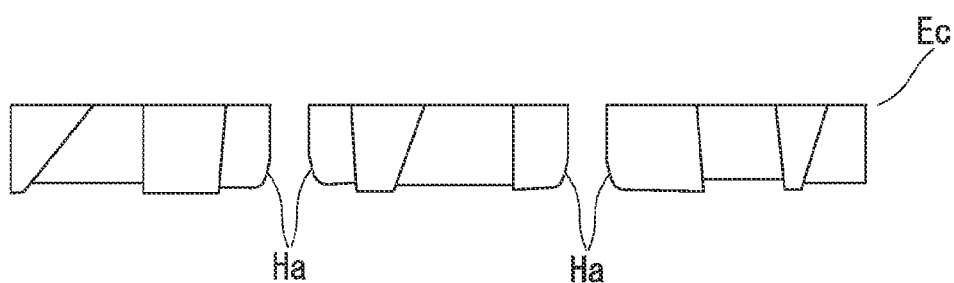
FIG. 4B is an enlarged cross-sectional view of an electrode plate manufactured from the conventional columnar crystal silicon ingot after use.

FIG. 3A is an enlarged cross-sectional view of the electrode plate Eb prior use. The electrode plate Eb is cut off at the location including the holes H as indicated by "III" in FIG. 2B. FIGS. 4A and 4B are shown as a comparison with the present embodiment. FIG. 4A is an enlarged cross-sectional view of an electrode plate Ec manufactured from the conventional columnar crystal silicon ingot prior to use. FIG. 4B is an enlarged cross-sectional view of the electrode plate Ec manufactured from the conventional columnar crystal silicon ingot after use.

In the electrode plate Ec manufactured from the conventional columnar crystal silicon ingot, the parts near the gas outlet of the holes H are widen due to corrosion by the fluoride-based gas after use (reference symbol in the drawing: Ha). Also, formation of the difference in level due to crystal grains is observed on the surface of the electrode plate Ec. This is because the crystal orientations exposed to the surface differ depending on each crystal, and the etching rates on the surface are different.

On the other hand, in the electrode plate Eb manufactured from the pseudo-single-crystalline ingot, the formation of the difference in level due to crystal grains is not observed even though the parts near the gas outlet of the holes H are widen due to corrosion by the fluoride-based gas after use (reference symbol in the drawing: Ha). This is because the electrode plate Eb is constituted of a single crystal, the crystal orientation on the surface is the same, and the etching rates on the surface is the same.

According to the silicon member for a semiconductor apparatus configured as described in the present embodiment (the silicon member for dry etching), the silicon member is fabricated by sawing the pseudo-single-crystalline silicon ingot obtained by growing a single-crystal from each of seed crystals. Thus, the silicon member contains a very small amount of crystal grain boundaries compared to one obtained by sawing the conventional columnar crystal silicon ingot, or it contains no crystal grain boundary at all. Therefore, when it is used for the electrode plate Eb for plasma etching for example, the particle formation in the silicon wafer or the device failure due to the falling of the impurities segregated in the crystal grain boundaries, $SiO_2$, or the like is reduced. Also, the formation of the difference in level due to the presence of different crystal grains is reduced enabling to obtain almost uniform etching.

Also, when each of seed crystals C are arranged in the same crystal orientation during placement of the multiple seed crystals C on the bottom part of the crucible 20, the crystal orientations of the single-crystals grown from the each of seed crystals C are the same. Thus, an apparent single-crystalline silicon ingot can be obtained. As a result, uniformity of etching can be further improved when the silicon member for a semiconductor apparatus obtained by sawing this apparent single-crystalline silicon ingot (the silicon member for dry etching) is used as the electrode plate for plasma etching, for example.

Also, when each of seed crystals C contacts each other without a space in between during placement of the seed crystals C on the bottom part of the crucible 20, poly crystal being grown between the seed crystals can be prevented. Thus, the columnar crystal silicon ingot with less crystal grain boundaries can be obtained. As a result, uniformity of etching can be further improved when the silicon member for a semiconductor apparatus obtained by sawing this columnar crystal silicon ingot with less crystal grain boundaries (the silicon member for dry etching) is used as the electrode plate for plasma etching, for example.

In the silicon member for a semiconductor apparatus (the silicon member for dry etching) of the present embodiment, it is preferable that at least ⅓ or more of the area exposed on a surface of a utilized part is occupied by a crystal grain regarded as a single-crystal grain having a same plane direction. When the silicon member is used for an electrode plate for plasma or dry etching, the term the "utilized part" means the entire part of the electrode plate. It is more preferable that ½ or more of the area is occupied by a crystal grain regarded as a single-crystal grain having a same plane direction. It is even more preferable that ⅔ or more of the area is occupied by a crystal grain regarded as a single-crystal grain having a same plane direction.

In this regard, in the silicon member for a semiconductor apparatus (the silicon member for dry etching) obtained by sawing the conventional columnar crystal silicon ingot, normally the area occupied by a single crystal grain on the surface of the utilized part is less than ⅓ of the entire surface of the utilized part. When the above-described conventional silicon member for a semiconductor apparatus (the silicon member for dry etching) is used as the electrode plate for plasma etching for example, the defects described in the "Problems to be Solved" section occur.

Contrary to the conventional silicon member, in the silicon member for a semiconductor apparatus of the present invention (the silicon member for dry etching), there is less crystal grain boundaries since at least ⅓ or more of the area exposed on a surface of a utilized part is occupied by a crystal grain regarded as a single-crystal grain having a same plane direction. Therefore, the above-mentioned defects are resolved. Also, when at least ½ or more of the area is occupied by a crystal grain regarded as a single-crystal grain having a same plane direction, etching with a higher uniformity can be obtained. Also, when at least ⅔ or more of the area is occupied by a crystal grain regarded as a single-crystal grain having a same plane direction, etching with an even higher uniformity can be obtained.

In the silicon member for a semiconductor apparatus (the silicon member for dry etching) of the present embodiment, it is preferable that the entire utilized part is made of a single crystal grain.

In this case, the silicon member can exert performance equivalent to the silicon member (the silicon member for dry etching) fabricated by sawing a single-crystalline silicon ingot.

Also, by using the silicon member for a semiconductor apparatus (the silicon member for dry etching) of the present invention, a relatively large-sized part whose size is 530 mmφ or more can be produced easily.

The size of the crystal grains was measured by: performing alkaline etching using KOH, NaOH, or the like, which has a high-crystal-orientation-dependency of the etching rate; identifying the individual crystals; and using an image analyzer.

By the way, the oxygen concentration in the electrode plate manufactured from a single-crystalline silicon by CZ method is higher than that of the unidirectionally solidified silicon (either poly-crystalline or the pseudo-single-crystalline). Also, normally, nitrogen is not included in the single-crystalline silicon by CZ method. Therefore, the etching rate in plasma etching is high and the electrode plate is worn off quickly. The reason for the low oxygen content in the unidirectionally solidified silicon (either poly-crystalline or the pseudo-single-crystalline) is the very low level of dissolution of $SiO_2$ because the inner surface of the silica-crucible does not directly contact with the silicon malt due to the silicon nitride coating on the inner surface of the crucible. The reason for the unidirectionally solidified silicon including nitrogen is because of dissolution of silicon nitride of the silicon nitride coating layer on the inner surface of the silica-crucible. When the oxygen content is low and nitrogen is dissolved below its solid solubility limit, the etching rate in plasma etching is reduced. Thus, the unidirectionally solidified silicon has a lower etching rate compared to the single-crystalline silicon by CZ method.

While preferred embodiments of the invention have been described and illustrated above, it should be understood that these are exemplary of the invention and are not to be considered as limiting. Additions, omissions, substitutions, and other modifications can be made without departing from the scope of the present invention. Accordingly, the invention is not to be considered as being limited by the foregoing description, and is only limited by the scope of the appended claims.

Figure 5:
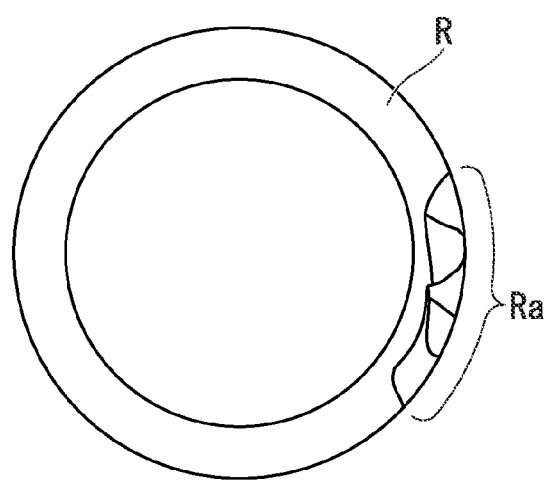
FIG. 5 is a plan view showing the ring R for dry etching in an embodiment of the present invention.

For example, the present embodiment was explained by naming the electrode plate for plasma etching as an example of the silicon member for a semiconductor apparatus. However, the present invention is not limited by the description. Thus, the silicon member for a semiconductor apparatus can be used for the variety of R rings or the like used for a semiconductor apparatus, such as the protection ring, the sealing ring, the earth ring, or the like as shown in FIG. 5. In the R ring shown in FIG. 5, the part made of poly-crystal Ra can be seen.

Also, usage of the silicon member for a semiconductor apparatus of the present invention is not only limited to the silicon member for plasma etching, but it can be applicable to the silicon member for etching with reactive gas in which the material is exposed to a reactive gas without using plasma.

EXAMPLES

Next, Examples of the present invention are explained.

Figure 6:
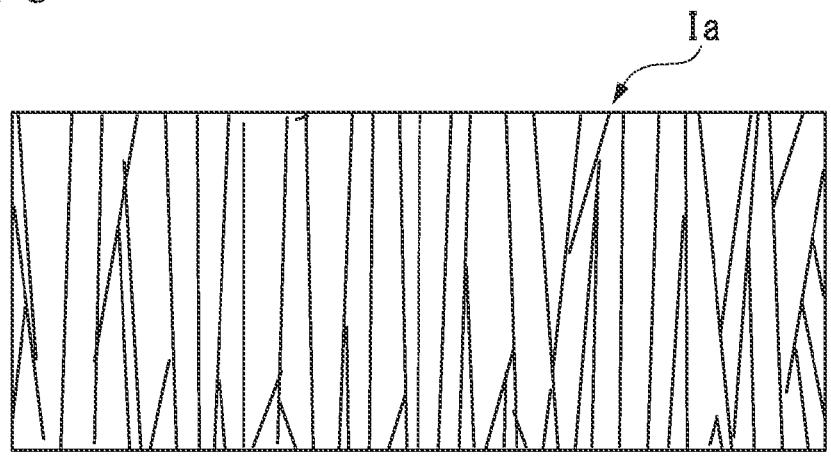
FIG. 6 is a schematic diagram of a longitudinal section of the conventional columnar crystal silicon ingot.
Figure 7:
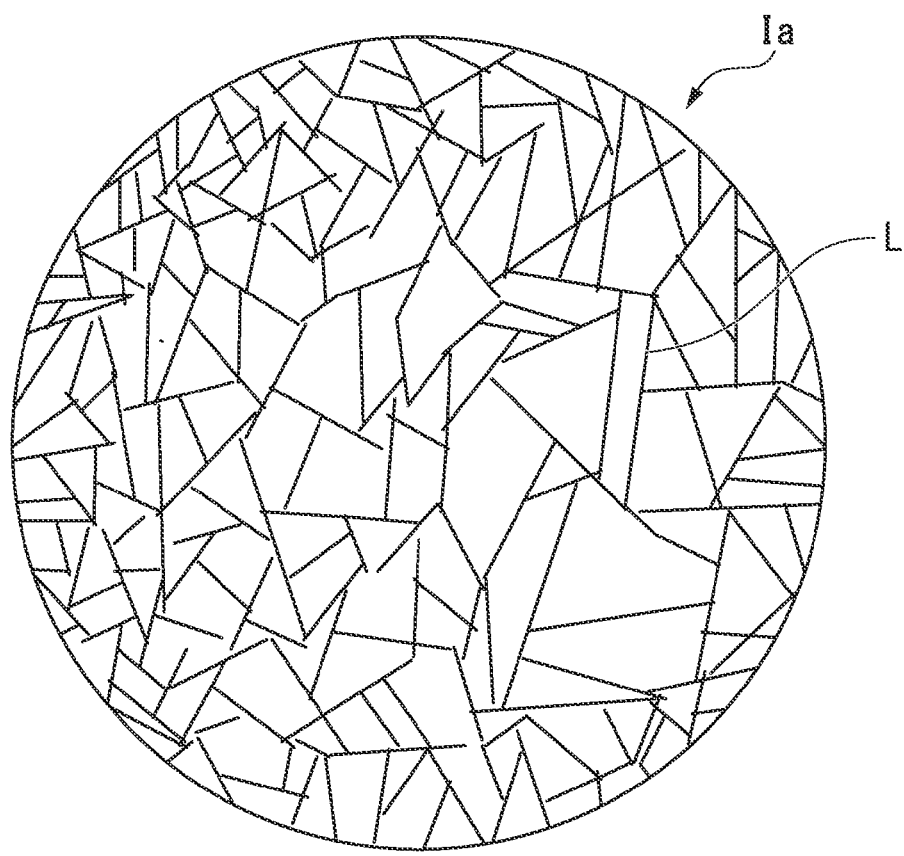
FIG. 7 is a schematic diagram of a cross section of the conventional columnar crystal silicon ingot.

First, a crucible having the internal diameter of 570 mmφ and retaining 176 kg of poly-silicon was inserted in a casting furnace to melt the poly-silicon. Then, an unidirectionally solidified silicon ingot in a cylindrical shape having the dimension: inner diameter of 570 mmφ; and height of 300 mm, was casted by the conventional method. FIG. 6 is a schematic diagram of a longitudinal section of the conventional columnar crystal silicon ingot Ia. FIG. 7 is a schematic diagram of a cross section of the conventional columnar crystal silicon ingot Ia. Each of straight lines in the cross section shown in FIG. 7 indicates a grain boundary L approximated by a straight line. The total length of crystal grain boundaries LS, which will be discussed later, means the sum of the lengths of the grain boundaries L within the measurement area. The average crystal grain size in the columnar crystal silicon ingot Ia was 5 mm.

Next, using a crucible having the identical dimension, seed crystals C made of a single-crystalline silicon plate, which has the dimension of 200 mm (length)×200 mm (width)×10 mm (thickness) and the crystal plane orientation [001], were placed on the bottom part of the crucible with a space of 1 cm in between each of them. At the inner circumferential part of the bottom part of the crucible, pieces obtained by cutting single-crystalline silicon plates, which have the dimension of 200 mm (length)×200 mm (width)×10 mm (thickness) and the crystal plane orientation [001], with a water jet in a rectangular shape were embedded without forming a space without excess or deficiency. The total weight of the raw silicon was 176 kg including the seed crystals paved on the bottom part. The example of placement of the seed crystals C is shown in FIG. 16C. In order to avoid the lower part of the seed crystals from completely melted, the output of the lower heater was adjusted and the silicon raw materials were melted from the upper part. The temperature at the bottom part of the crucible was set to 1380° C. In order for the crystals to be solidified unidirectionally, each of outputs of the lower and upper heaters was controlled to grow the crystals.

Figure 8:
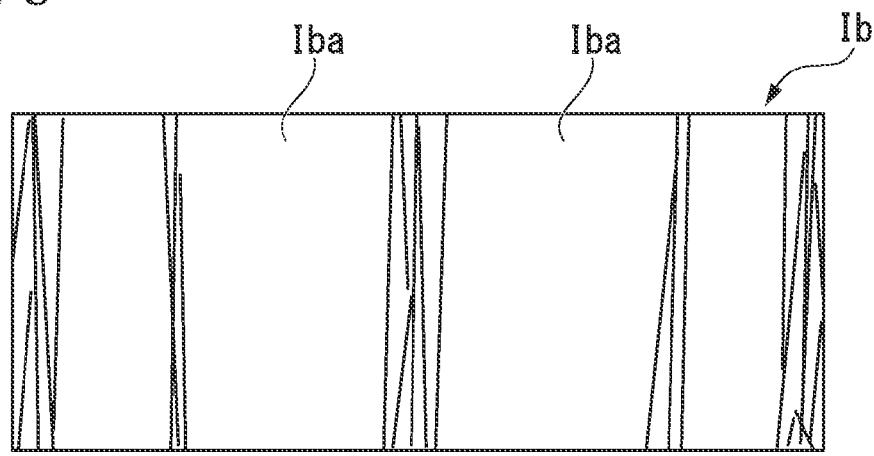
FIG. 8 is a schematic diagram of a longitudinal section of an example of the pseudo-single-crystalline ingot.
Figure 9:
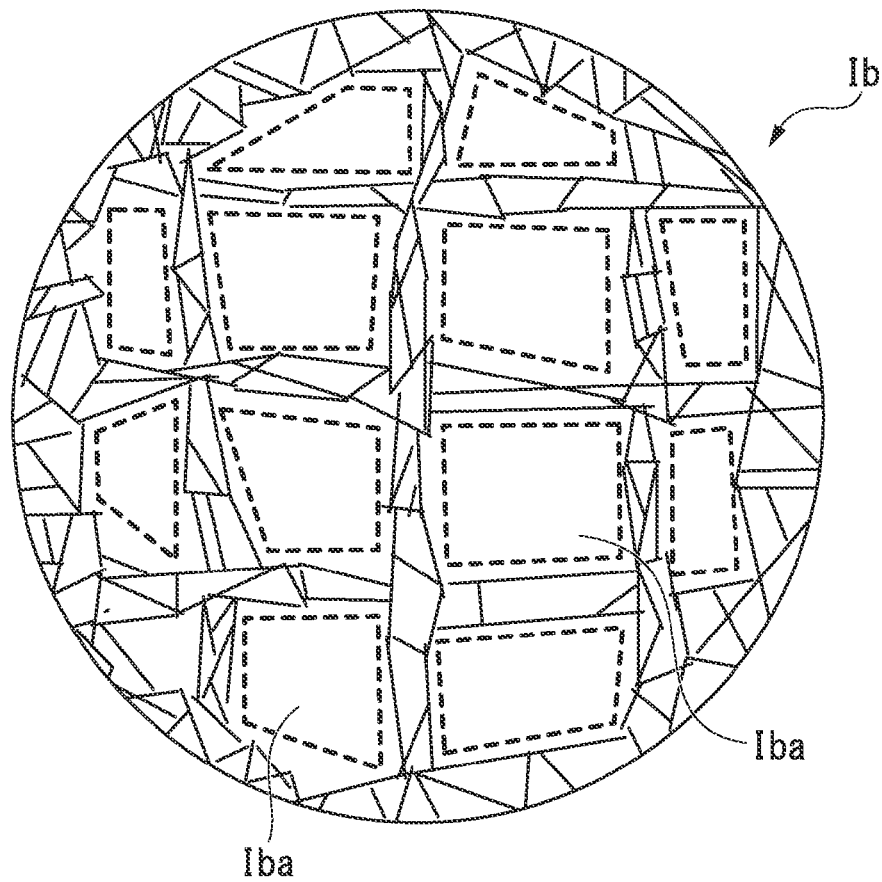
FIG. 9 is a schematic diagram of a cross section of an example of the pseudo-single-crystalline ingot. The region enclosed by the broken line is the single-crystalline region corresponding to a seed crystal in the pseudo-single-crystalline ingot.

The product manufactured as described above is the pseudo-single-crystalline ingot Ib shown in FIGS. 8 and 9. FIG. 8 is a schematic diagram of the pseudo-single-crystalline ingot Ib. FIG. 9 is a schematic diagram of a cross section of the pseudo-single-crystalline ingot Ib.

In the pseudo-single-crystalline silicon ingot Ib, a small number of tiny crystals ware formed in the border between a seed crystal C and other seed crystal C. However, mainly crystals were continuously grown from the single crystals at the bottom part in the other part. As a result, the crystals were grown retaining the crystal orientation of the single-crystals from the seed crystal parts. Accordingly, the pseudo-single-crystalline silicon ingot Ib including the single-crystalline parts Iba with a substantially the same sizes as the original single-crystalline plates was casted. The side and diagonal lengths of the largest single-crystalline part Iba were 140 mm and 200 mm, respectively. The crystal plane orientation of the single-crystalline part Iba was [001].

Also, by using seed crystals C made of a single-crystalline silicon plate, which has the dimension of 200 mm (length)×200 mm (width)×10 mm (thickness) and the crystal plane orientation [111], another pseudo-single-crystalline silicon ingot was casted in the same method described above. In this case, a similar pseudo-single-crystalline silicon ingot was obtained, but the obtained pseudo-single-crystalline silicon ingot had the single-crystalline parts Iba with the crystal plane orientation [111].

Figure 10:
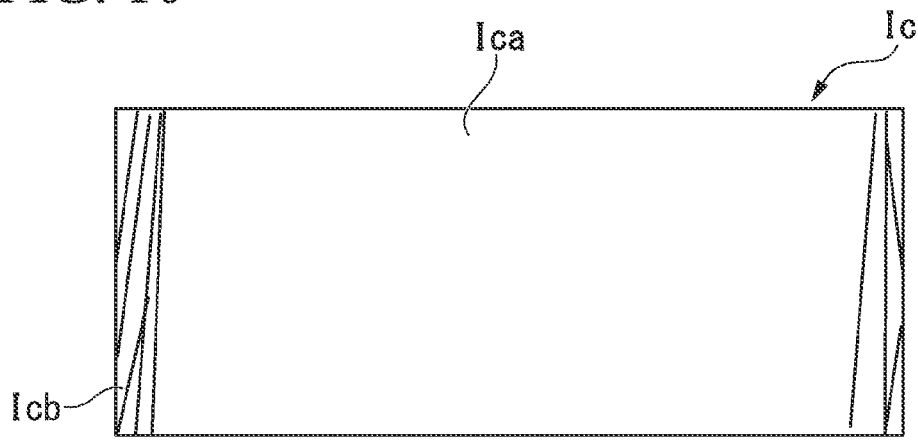
FIG. 10 is a schematic diagram of a longitudinal section of another example of the pseudo-single-crystalline ingot.
Figure 11:
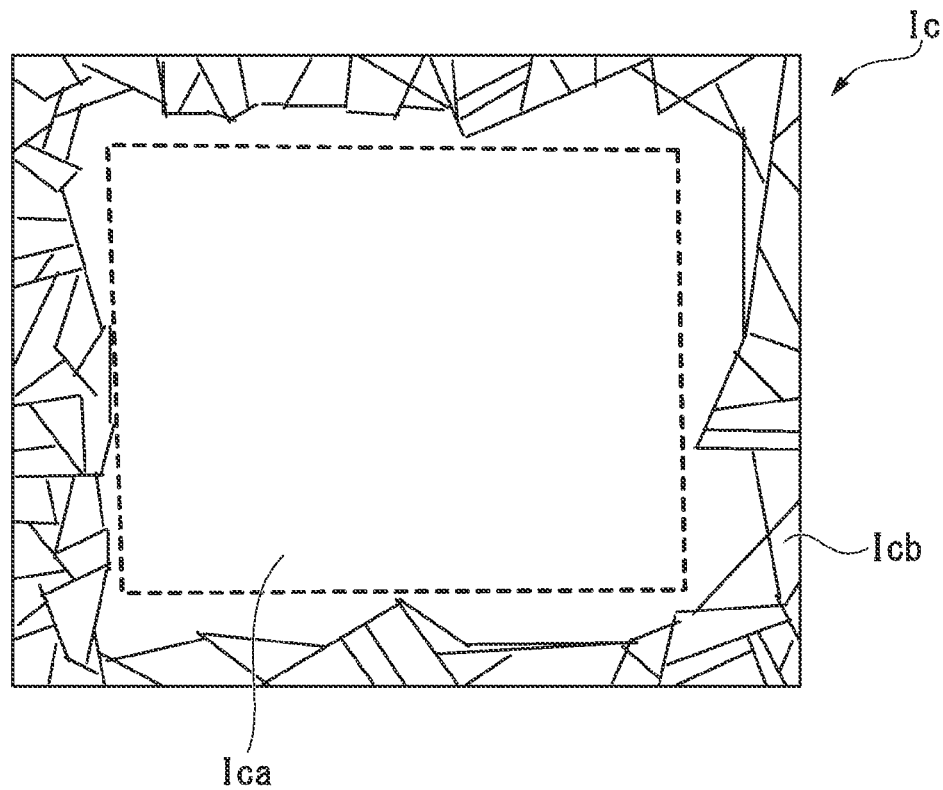
FIG. 11 is a schematic diagram of a cross section of another example of the pseudo-single-crystalline ingot. The region enclosed by the broken line is the single-crystalline region corresponding to a seed crystal in the pseudo-single-crystalline ingot (in the case where it is a square-shaped crystal and the seed crystals are placed without a space in between).

Next, a square crucible with an excellent flatness was selected. The sides of the square crucible were 670 mm×670 mm×420 mm. In the region of 600 mm×600 mm excluding the outer peripheral part of the inner bottom surface, seed crystals C made of a single-crystalline silicon plate, which has the dimension of 300 mm (length)×300 mm (width)×10 mm (thickness) and the crystal plane orientation [001], were placed on the bottom part of the crucible without a space in between. The example of placement of the seed crystals C is shown in FIG. 16B. Then, the pseudo-single-crystalline silicon ingot Ic was casted in the same condition as the casting of the silicon ingot Ib by arranging the seed crystals C on the afore-mentioned bottom part in unidirectionally solidification. FIG. 10 is a schematic diagram of a longitudinal section of the pseudo-single-crystalline ingot Ic. FIG. 11 is a schematic diagram of a cross section of the pseudo-single-crystalline ingot Ic.

In the pseudo-single-crystalline silicon ingot Ic, the tiny crystal grain was not formed within the central region Ica having the dimension of 600 mm×600 mm. Thus, this region became a single-crystalline-form entirely. The crystal plane orientation in this single-crystalline part was [001]. Also, the outer peripheral region Icb of 35 mm was columnar crystals with the average crystal diameter of 5 mm in the pseudo-single-crystalline silicon ingot Ic.

Figure 14:
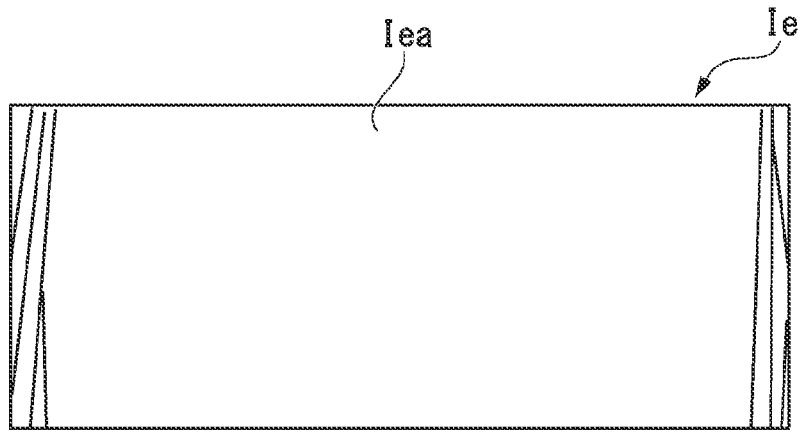
FIG. 14 is a schematic diagram of a longitudinal section of another example of the pseudo-single-crystalline ingot.
Figure 15:
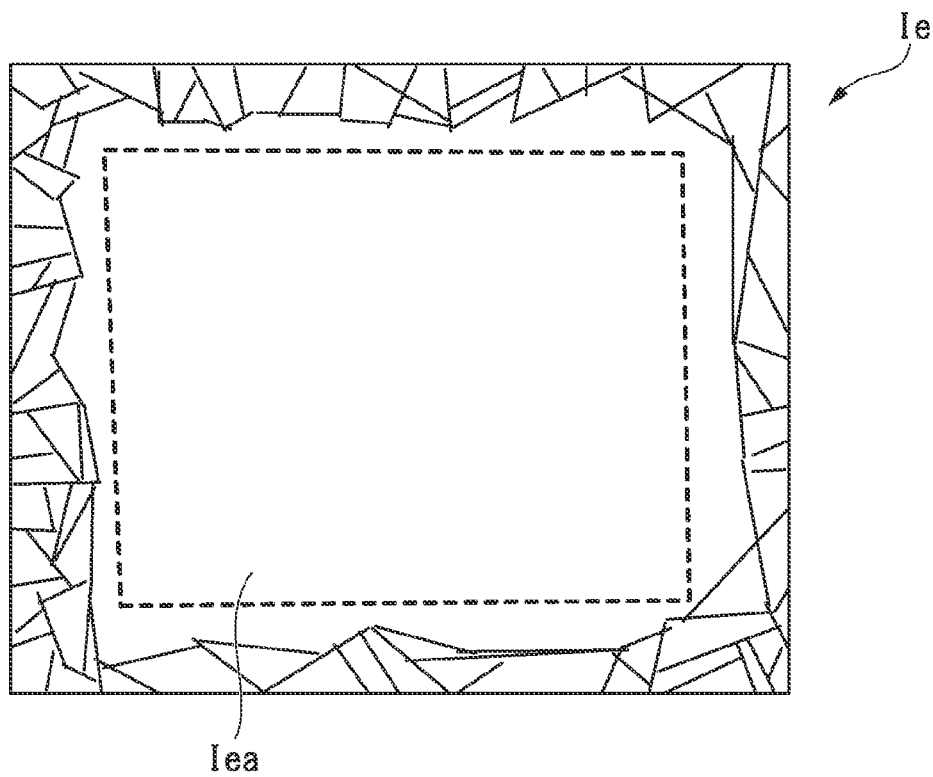
FIG. 15 is a schematic diagram of a cross section of another example of the pseudo-single-crystalline ingot. The region enclosed by the broken line is the single-crystalline region corresponding to a seed crystal in the pseudo-single-crystalline ingot (in the case where it is a square-shaped crystal and the seed crystals are placed without a space in between).

Also, the square crucible with an excellent flatness was selected. The size of the square crucible was 670 mm×670 mm×420 mm. In the region of 600 mm×600 mm excluding the outer peripheral part of the inner bottom surface, seed crystals C made of a single-crystalline silicon plate, which has the dimension of 300 mm (length)×300 mm (width)×20 mm (thickness) and the crystal plane orientation [001], were placed on the bottom part of the crucible without a space in between. The example of placement of the seed crystals C is shown in FIG. 16B. Then, the pseudo-single-crystalline silicon ingot Ie was casted in the same condition as the casting of the silicon ingot Ic by arranging the seed crystals C on the afore-mentioned bottom part in unidirectionally solidification. FIG. 14 is a schematic diagram of a longitudinal section of the pseudo-single-crystalline ingot Ie. FIG. 15 is a schematic diagram of a cross section of the pseudo-single-crystalline ingot Ie.

In the pseudo-single-crystalline silicon ingot Ie, the tiny crystal grain was not formed within the central region Iea having the dimension of 600 mm×600 mm. Thus, this region became a single-crystalline-form entirely. The crystal plane orientation in this single-crystalline part was [001]. Also, the outer peripheral region Ieb of 35 mm was columnar crystals with the average crystal diameter of 5 mm in the pseudo-single-crystalline silicon ingot Ie.

Figure 12:
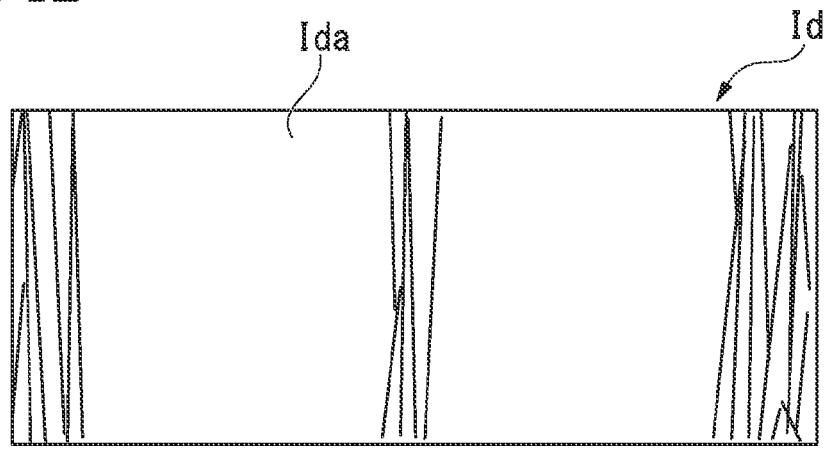
FIG. 12 is a schematic diagram of a longitudinal section of another example of the pseudo-single-crystalline ingot.
Figure 13:
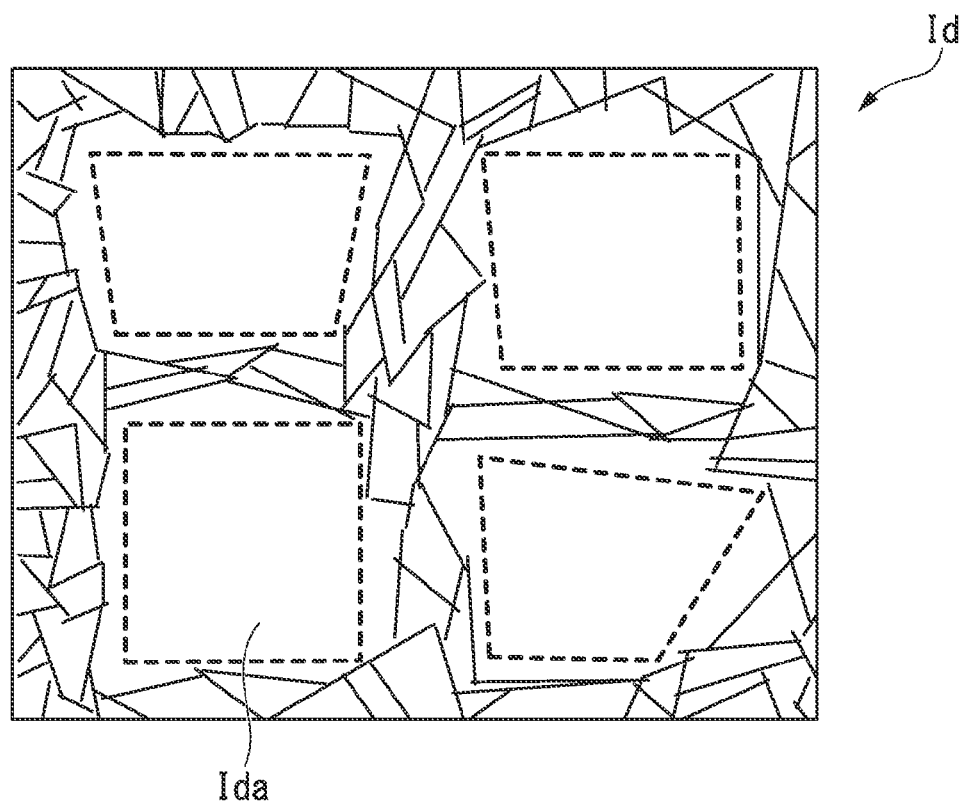
FIG. 13 is a schematic diagram of a cross section of another example of the pseudo-single-crystalline ingot. The region enclosed by the broken line is the single-crystalline region corresponding to a seed crystal in the pseudo-single-crystalline ingot (in the case where it is a square-shaped crystal and the seed crystals are placed with a space in between).

Further, the square crucible with an excellent flatness was selected. The size of the square crucible was 670 mm×670 mm×420 mm. In the region of 600 mm×600 mm excluding the outer peripheral part of the inner bottom surface, seed crystals C made of a single-crystalline silicon plate, which has the dimension of 300 mm (length)×300 mm (width)×10 mm (thickness) and the crystal plane orientation [001], were placed on the bottom part of the crucible with a space in between. The example of placement of the seed crystals C is shown in FIG. 16A. Then, the pseudo-single-crystalline silicon ingot Id was casted in the same condition as the casting of the silicon ingot Ib by arranging the seed crystals C on the afore-mentioned bottom part in unidirectionally solidification. FIG. 12 is a schematic diagram of a longitudinal section of the pseudo-single-crystalline ingot Id. FIG. 13 is a schematic diagram of a cross section of the pseudo-single-crystalline ingot Id.

Also, by using seed crystals C made of a single-crystalline silicon plate, which has the dimension of 200 mm (length)×200 mm (width)×10 mm (thickness) and the crystal plane orientation [111], another pseudo-single-crystalline silicon ingot was casted in the same method described above. In this case, a similar pseudo-single-crystalline silicon ingot was obtained, but the obtained pseudo-single-crystalline silicon ingot had the single-crystalline parts Ida with the crystal plane orientation [111].

Electrode plates for dry etching with the dimension of 380 mmφ×10 mm were prepared from the columnar crystal silicon ingot Ia, the pseudo-single-crystalline silicon ingots Ib, Ic, Ie, and the conventionally used silicon ingot from a single-crystal. One manufactured from the conventional columnar crystal silicon ingot Ia was referred as "Columnar crystal." One manufactured from the pseudo-single-crystalline silicon ingot Ib was referred as "Pseudo-single-crystal 1." One manufactured from the pseudo-single-crystalline silicon ingot Ic was referred as "Pseudo-single-crystal 2." One manufactured from the pseudo-single-crystalline silicon ingot Ie was referred as "Pseudo-single-crystal 3." One manufactured from the single-crystal silicon ingot was referred as "Single-crystal." By using 300 mm silicon wafers for monitoring purpose, these samples were compared by measuring the number of particles on the single-crystalline 300 mmφ silicon wafer and the concentration of impurities on the surface. The number of the particle was measured with the particle counter, model KLA-Tencor Surfscan.

Measurement of the number of particles was performed by following the procedures explained below. A parallel-plate apparatus of an oxide film dry etcher for 300 mmφ was used. For the electrode plate, a single-crystalline silicon and a columnar crystal silicon were used separately. The operating pressure was 700 torr. RF power was 300 W. For the gas, the gas mixture including $CF_4$ and He in the ratio of 4:1 was flown in the flow rate of 800 $cm^3$/min. After performing etching 200 times, the 300 mmφ wafers for the monitoring purpose were placed in the apparatus. Then, they were exposed for 1 minute in the condition where the RF power was off and the inert gas Ar was flown. Then, the number increase of the particles after the exposure compared to the number before the exposure was measured. Then, the concentration of impurities on the surface was measured.

The results of the measurements are shown in Table 1.

TABLE 1

| Electrode plane type | Particle size (μm), particles/wafer | | | | | | |
|---|---|---|---|---|---|---|---|
| | ≥0.065 | ≥0.106 | ≥0.12 | ≥0.16 | ≥0.2 | ≥0.3 | ≥0.5 |
| Columnar crystal | 23 | 19 | 9 | 8 | 2 | 0 | 0 |
| Pseudo-single crystal 1 | 14 | 6 | 3 | 2 | 1 | 0 | 0 |
| Pseudo-single crystal 2 | 9 | 4 | 5 | 1 | 0 | 0 | 0 |
| Pseudo-single crystal 3 | 9 | 4 | 4 | 0 | 0 | 0 | 0 |
| Single-crystal | 3 | 0 | 0 | 0 | 0 | 0 | 0 |

From the results shown in Table 1, it was understood that the numbers of particles were reduced when the electrode plates (Pseudo-single crystals 1, 2, 3) manufactured from the pseudo-single-crystalline silicon ingots Ib, Ic, and Ie were used compared to the electrode plate (Columnar crystal) manufactured from the conventional columnar crystal silicon ingot Ia. Particularly, it was understood that the numbers of particles were reduced to the level close up to that of Single-crystal in the electrode plates of Pseudo-single crystals 2 and 3 even though they were not as low as to that of Single-crystal.

Also, the concentration of impurities was measured by ICP-MS method using parts of the crystals uses for Columnar crystal, Pseudo-crystal 1, Pseudo-crystal 2, Pseudo-crystal 3, and Single-crystal, which were used as the electrode plates.

The results of the measurements are shown in Table 2.

TABLE 2

| Analysis sample | Al | Na | Cr | Fe | Ni | Cu | Zn |
|---|---|---|---|---|---|---|---|
| Columnar crystal | <0.1 | <0.1 | <0.1 | 1-7 | 0.6-1.4 | 3.6 | 0.2 |
| Pseudo-single crystal 1 | <0.1 | <0.1 | <0.1 | 0.3 | <0.1 | 1.2 | <0.1 |
| Pseudo-single crystal 2 | <0.1 | <0.1 | <0.1 | 0.2 | <0.1 | 0.9 | <0.1 |
| Pseudo-single crystal 3 | <0.1 | <0.1 | <0.1 | 1.2 | <0.1 | 0.7 | <0.1 |
| Single-crystal | <0.1 | <0.1 | <0.1 | <0.1 | <0.1 | <0.1 | <0.1 |

Unit: ppbwt

From the results shown in Table 2, it was understood that the concentrations of impurities of Fe, Ni, Cu, and Zn were reduced when the electrode plates (Pseudo-single crystals 1, 2, 3) manufactured from the pseudo-single-crystalline silicon ingots Ib, Ic, and Ie were used compared to the electrode plate (Columnar crystal) manufactured from the conventional columnar crystal silicon ingot Ia.

Also, in regard with the above-mentioned electrode plates for dry etching, the single-crystalline region area (the area occupied by single-crystalline regions) was measured to calculate its ratio relative to the entire cross sectional area. The single-crystalline region area was obtained as follows. First, the single-crystalline region area was enclosed by broken lines as shown in FIGS. 9, 11, 13, and 15. The broken lines were served as the boundaries between the poly-crystalline region outside of the large single-crystalline region and the single-crystalline region inside. The boundaries were drawn several mm (in the present Examples, the maximum length from the outer poly-crystalline region into the inner single-crystalline region was set to 5 mm) inside from the outer poly-crystalline region into the inner single-crystalline region. The tetragon was drawn in a way that the area of the drawn tetragon to be the largest in the given condition. After drawing the tetragon, the sum of areas of the single-crystalline regions was divided by the cross sectional area of the original crystal The results of the measurements are shown in Table 3.

TABLE 3

| | | Square-shaped crystal | | | Round-shaped crystal | | |
|---|---|---|---|---|---|---|---|
| | | Single-crystalline region area ($cm^2$) | Sectional area ($cm^2$) | Ratio | Single-crystalline region area ($cm^2$) | Sectional area ($cm^2$) | Ratio |
| Single-crystalline area | Columnar crystal | — | 4489 | — | — | 2550 | — |
| | Pseudo-single crystal 1 | 1616 | 4489 | 0.36 | 893 | 2550 | 0.35 |

TABLE 3-continued

| | | Square-shaped crystal | | | Round-shaped crystal | | |
|---|---|---|---|---|---|---|---|
| | | Single-crystalline region area (cm$^2$) | Sectional area (cm$^2$) | Ratio | Single-crystalline region area (cm$^2$) | Sectional area (cm$^2$) | Ratio |
| | Pseudo-single crystal 2 | 2289 | 4489 | 0.51 | — | — | — |
| | Pseudo-single crystal 3 | 2424 | 4489 | 0.54 | — | — | — |
| | Single-crystal | — | — | — | 1134 | 1134 | 1.00 |

From the results shown in Table 3, it was understood that the ratios of the single-crystalline region areas in the square-shaped Pseudo-single crystal 1, the square-shaped Pseudo-single crystal 2, and the square-shaped Pseudo-single crystal 3 were 36%, 51%, and 54%, respectively. Also, in the round-shaped Pseudo-single crystal 1, the ratio was 35%.

Also, in regard with the above-mentioned electrode plates for dry etching, the density of the crystal grain boundary was measured. The density of the crystal grain boundary was defined as explained below. First, the lengths of crystal grain boundaries within the cross section were added up. Then, the density was obtained by dividing the sum of the lengths of the crystal grain boundaries by the cross sectional area of the original crystal. In the present Examples, the measurements were performed on the cross section perpendicular to the solidification direction of the unidirectionally solidification.

The results of the measurements are shown in Table 4.

TABLE 4

| | | Square-shaped crystal | | | Round-shaped crystal | | |
|---|---|---|---|---|---|---|---|
| | | Total length of crystal grain boundary (cm) | Sectional area(cm$^2$) | Crystal grain boundary density (cm$^{-1}$) | Total length of crystal grain boundary (cm) | Sectional area (cm$^2$) | Crystal grain boundary density (cm$^{-1}$) |
| Crystal grain boundary length | Columnar crystal | 1167 | 4489 | 0.26 | 2468 | 8820 | 0.28 |
| | Pseudo-single crystal 1 | 763 | 4489 | 0.17 | 2088 | 8820 | 0.24 |
| | Pseudo-single crystal 2 | 494 | 4489 | 0.11 | — | — | — |
| | Pseudo-single crystal 3 | 449 | 4489 | 0.10 | — | — | — |
| | Single-crystal | — | — | — | 0 | 1134 | 0.00 |

Crystal grain boundary density = Total length of crystal grain boundaries per a unit area/Area (cm/cm$^2$)

From the results shown in Table 4, it was understood that the densities of crystal grain boundaries in the square-shaped Columnar crystal, the square-shaped Pseudo-single crystal 1, the square-shaped Pseudo-single crystal 2, and the square-shaped Pseudo-single crystal 3 were 0.26, 0.17, 0.11, and 0.10, respectively. Also, in the round-shaped Columnar crystal and the round-shaped Pseudo-single crystal 1, the densities were 0.28 and 0.24, respectively.

Also, plasma etching rates of the silicon members for a semiconductor apparatus manufactured from the above-mentioned Columnar crystalline silicon ingot, Pseudo-crystalline silicon ingots, and the conventionally used silicon ingot made of a single crystal were evaluated.

The test samples for plasma etching were prepared from each ingot by sawing to obtain a plate with each side of 100 mm and the thickness of 1 mm, and mirror-polishing the major surface of the plate. Then, by performing the plasma etching treatment on the test samples using a plasma etching apparatus (YR-4011 1 H-DXII, manufactured by U-TEC Corporation) and measuring difference in level between the etched part and the masked part using a surface roughness meter (Dektak, manufactured by Bruker AXS Corporation), the etching rate was calculated. Etching was performed in the condition where: the degree of vacuum was 50 mTorr; the etching time was 30 minutes; the etching gas was $SF_6$; the flow rate of the etching gas was 10 sccm; and the output power was 100 W.

Also, the concentrations of oxygen and nitrogen in the silicon members for a semiconductor apparatus were measured. In addition, the number of the particles after etching was measured.

The results of the measurements are shown in Table 5.

TABLE 5

| | | Etching rate, μm/h | Oxygen concentration, atoms/ml | Nitrogen concentration, atoms/ml | Particle number (larger than 0.065 μm), particles |
|---|---|---|---|---|---|
| Example 1 of the present invention | Pseudo-single-Crystalline 1 | 32.1 | $4.0 \times 10^{17}$ | $2.0 \times 10^{15}$ | 14 |
| Example 2 of the present invention | Pseudo-single-Crystalline 2 | 32.7 | $1.2 \times 10^{17}$ | $7.5 \times 10^{14}$ | 9 |

TABLE 5-continued

| | | Etching rate, μm/h | Oxygen concentration, atoms/ml | Nitrogen concentration, atoms/ml | Particle number (larger than 0.065 μm), particles |
|---|---|---|---|---|---|
| Example 3 of the present invention | Pseudo-single-Crystalline 3 | 32.5 | $7.3 \times 10^{16}$ | $3.1 \times 10^{15}$ | 11 |
| Comparative Example 1 | Single-crystalline | 40.0 | $1.1 \times 10^{18}$ | — | 3 |
| Comparative Example 2 | Single-crystalline | 38.5 | $1.0 \times 10^{18}$ | — | 4 |
| Comparative Example 3 | Columnar-crystalline | 33.5 | $4.3 \times 10^{17}$ | $1.3 \times 10^{15}$ | 23 |
| Comparative Example 4 | Columnar-crystalline | 34.7 | $1.0 \times 10^{17}$ | $7.5 \times 10^{14}$ | 25 |

From the results shown in Table 5, it was understood that the oxygen concentration was $5 \times 10^{17}$ atoms/ml or lower, the nitrogen concentration was $7 \times 10^{14}$ atoms/ml or higher and $4 \times 10^{15}$ atoms/ml or lower, and the etching rate was slow. This was because $Si_3N_4$ precipitates would be formed when the nitrogen concentration was $4 \times 10^{15}$ atoms/ml or higher.

BRIEF DESCRIPTION OF THE REFERENCE SYMBOLS

C: Seed crystal
Ib: Pseudo-single-crystalline silicon ingot
Ic: Pseudo-single-crystalline silicon ingot
Ie: Pseudo-single-crystalline silicon ingot
Eb: Electrode plate manufactured from the pseudo-single-crystalline silicon ingot
R: Ring manufactured from the pseudo-single-crystalline silicon ingot

What is claimed is:

1. A silicon member for a semiconductor apparatus comprising a plate body,
wherein
the silicon member is fabricated from a columnar pseudo-single-crystalline silicon ingot obtained by growing a single-crystal from each of a plurality of seed crystals by:
placing the plurality of seed crystals that are made of a single-crystalline silicon plate at an inner circumferential part on a bottom part of a crucible;
unidirectionally solidifying a molten silicon in the crucible; and
cutting the solidified silicon horizontally to obtain the plate body,
the plate body consists of: a single-crystalline region made of the single-crystal corresponding to one of the plurality of seed crystals in the central; and a non-single-crystalline region made of columnar crystals in a peripheral part,
an area ratio of the single-crystalline region to an area of a top surface of the plate body is 0.35 to 0.54,
a crystal grain boundary density P, which is defined by a formula P=LS/A, is 0.1 or more and 0.24 or less in the silicon plate, LS being a total length of grain boundaries of crystal grains on a cross section and A being an area of the cross section, and
multiple through-holes are formed in the single crystal regions of the silicon member.

2. The silicon member for a semiconductor apparatus according to claim 1, wherein a diameter of the silicon member exceeds 450 mmφ.

3. The silicon member for a semiconductor apparatus according to claim 2, wherein each of the plurality of seed crystals are aligned in a same crystal orientation when the plurality of seed crystals are placed on the bottom part of the crucible.

4. The silicon member for a semiconductor apparatus according to claim 2, wherein the plurality of seed crystals contact each other so as to have no space in between when the seed crystals are placed on the bottom part of the crucible.

5. The silicon member for a semiconductor apparatus according to claim 2, wherein an oxygen concentration in the crystal is $5 \times 10^{17}$ atoms/ml or less.

6. The silicon member for a semiconductor apparatus according to claim 2, wherein a nitrogen concentration in the crystal is $7 \times 10^{14}$ atoms/ml or more and $4 \times 10^{15}$ atoms/ml or less.

7. The silicon member for a semiconductor apparatus according to claim 1, wherein a diameter of the silicon member is 500 mmφ or more.

8. The silicon member for a semiconductor apparatus according to claim 1, wherein a diameter of the silicon member is 530 mmφ or more.

9. The silicon member for a semiconductor apparatus according to claim 1, wherein each of the plurality of seed crystals are aligned in a same crystal orientation when the plurality of seed crystals are placed on the bottom part of the crucible.

10. The silicon member for a semiconductor apparatus according to claim 1, wherein the plurality of seed crystals contact each other so as to have no space in between when the seed crystals are placed on the bottom part of the crucible.

11. The silicon member for a semiconductor apparatus according to claim 1, wherein an oxygen concentration in the crystal is $5 \times 10^{17}$ atoms/ml or less.

12. The silicon member for a semiconductor apparatus according to claim 1, wherein a nitrogen concentration in the crystal is $7 \times 10^{14}$ atoms/ml or more and $4 \times 10^{15}$ atoms/ml or less.

13. A method of producing a silicon member for a semiconductor apparatus, the method comprising the steps of:
placing a plurality of seed crystals made of a single-crystalline silicon plate at an inner circumferential part on a bottom part of a crucible;
melting a silicon raw material to obtain a silicon melt by inserting the silicon raw material in the crucible, in which the single-crystalline silicon is plate placed, and melting the silicon raw material in a condition where the single-crystalline silicon plate is not melted completely by applying electricity to an upper heater, which is provided above the crucible, and a lower heater, which is provided below the crucible; and by controlling output of the lower heater;
unidirectionally solidifying the silicon melt to obtain a columnar pseudo-single-crystalline silicon ingot by unidirectionally solidifying the silicon melt upward from the bottom part of the crucible where the single-crystalline silicon plate is placed; and
machining the columnar pseudo-single-crystalline silicon ingot to obtain the silicon member for the semiconductor apparatus with multiple through-holes formed in the single crystal regions of the silicon member after cutting the solidified silicon horizontally to obtain a plate body, wherein the plate body consists of: a single-crystalline region made of the single-crystal corresponding to one of the plurality of seed crystals in the central; and a non-single-crystalline region made of columnar crystals in a peripheral part, an area ratio of the single-crystalline region to an area of a top surface of the plate body is 0.35 to 0.54, a crystal grain boundary density P, which is defined by a formula $P=LS/A$, is 0.1 or more and 0.24 or less in the silicon plate, LS being a total length of grain boundaries of crystal grains on a cross section and A being an area of the cross section.

* * * * *